US006430250B1

(12) United States Patent
Ruat et al.

(10) Patent No.: US 6,430,250 B1
(45) Date of Patent: Aug. 6, 2002

(54) RAPID TRIGGERING DIGITAL TIMER

(75) Inventors: Ludovic Ruat, Greasque; Olivier Ferrand, Puyloubier, both of (FR)

(73) Assignee: STMicroelectronics, SA, Crolles (FR)

( * ) Notice: Subject to any disclaimer, the term of this patent is extended or adjusted under 35 U.S.C. 154(b) by 0 days.

(21) Appl. No.: 09/610,506

(22) Filed: Jul. 6, 2000

(30) Foreign Application Priority Data

Jul. 30, 1999 (FR) ........................................... 99 10149

(51) Int. Cl.[7] ................................................ H03K 23/00

(52) U.S. Cl. ........................................ 377/118; 327/145

(58) Field of Search ................................. 377/118, 119, 377/112, 51; 327/141, 144, 145, 151, 160

(56) References Cited

U.S. PATENT DOCUMENTS 3,753,127 A 8/1973 Rowe ......................... 377/116
4,499,589 A 2/1985 Geesen ........................ 377/55
4,516,861 A 5/1985 Frew et al. ................. 368/120
4,596,027 A * 6/1986 Bernardson ................. 377/118
4,692,640 A * 9/1987 Suzuki et al. ............... 377/118
5,117,173 A * 5/1992 Oliva et al. .................... 320/21
5,526,391 A 6/1996 Shankar et al. ............... 377/47

FOREIGN PATENT DOCUMENTS

DE 1 188 135 3/1965

* cited by examiner

*Primary Examiner*—Tuan T. Lam

(57) ABSTRACT

The invention relates to a digital timer (20) comprising a binary counter (21) driven by a counting clock signal (Hc), the counter (21) presenting a stabilization time after each counting pulse, and means for delivering a detection signal (DS2) with a predetermined value when a counting order (N) is reached by the counter. According to the invention, the timer comprises wired logic means (22) arranged for detecting, at the output of the counter, a counting value (N−1) which is immediately before the counting order (N) in relation to the counting direction, and delivering an intermediate signal (DS1) with a predetermined value, as well means (24) for sampling the intermediate signal (DS1) at a moment when the counter receives the next counting pulse.

8 Claims, 2 Drawing Sheets

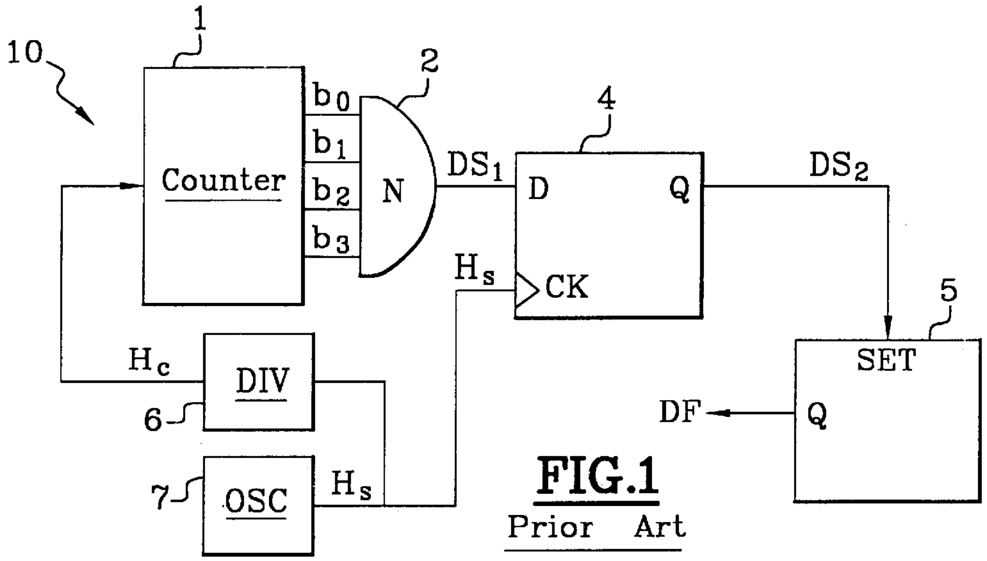
FIG.1
Prior Art
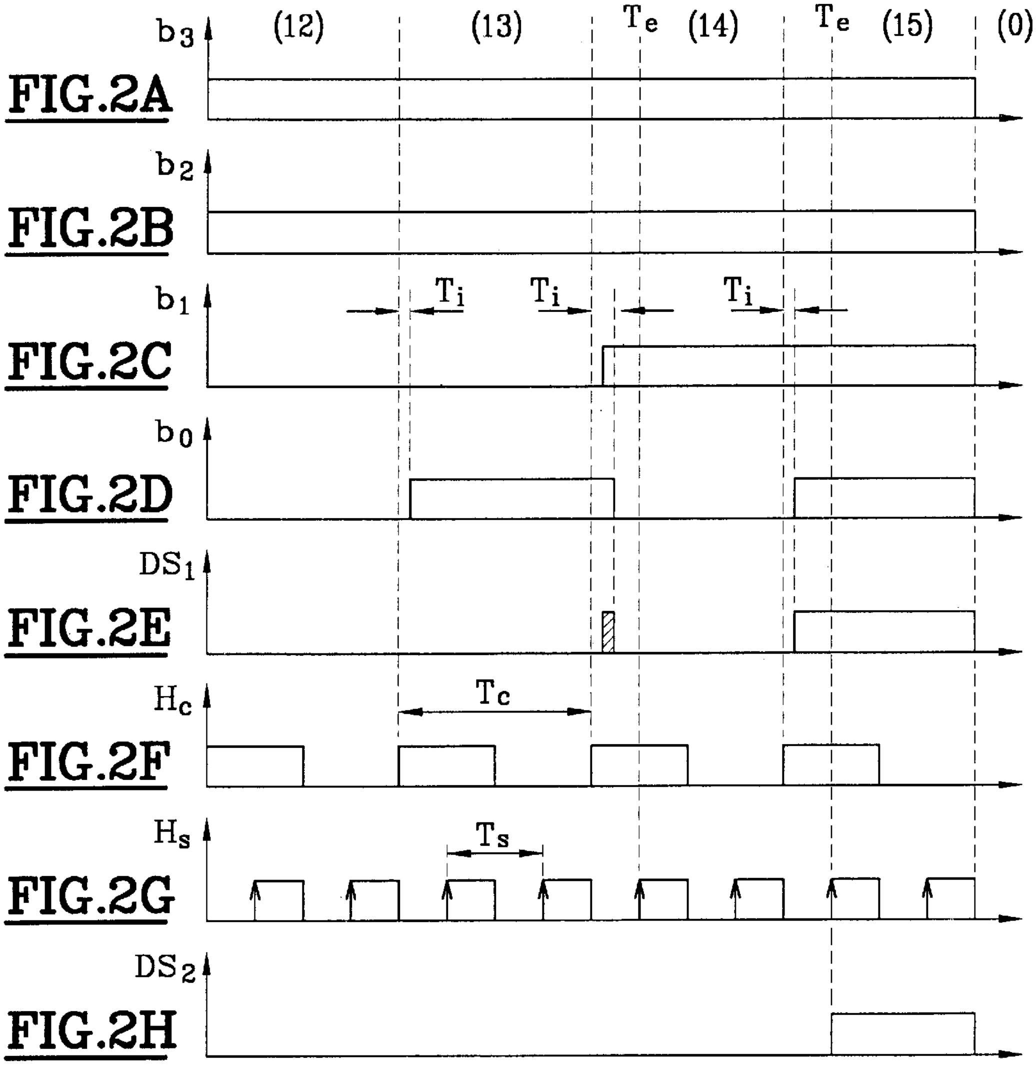
FIG.2A
FIG.2B
FIG.2C
FIG.2D
FIG.2E
FIG.2F
FIG.2G
FIG.2H
Prior Art

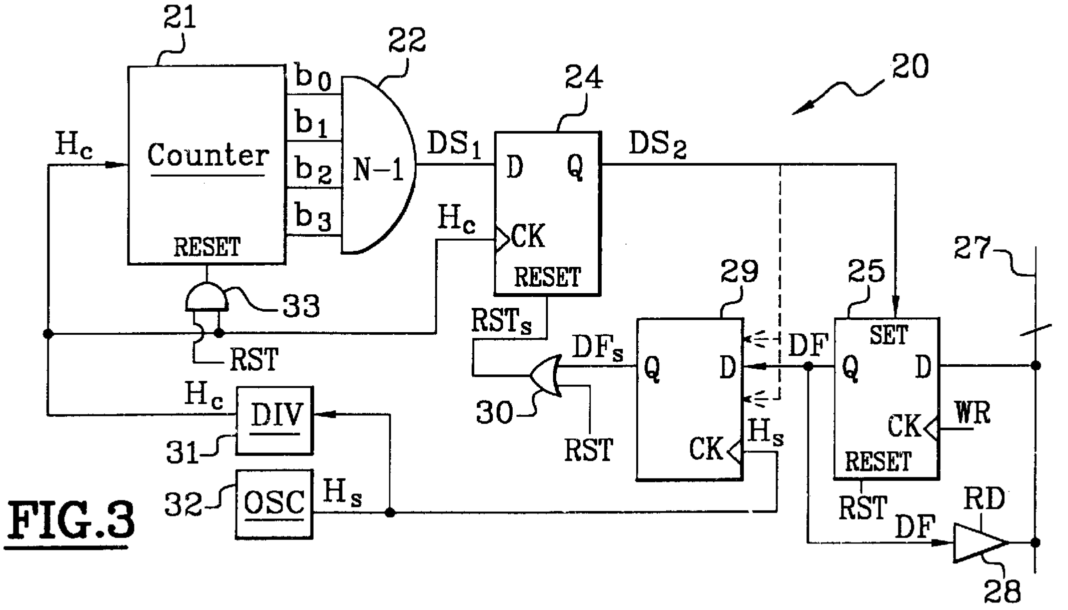
FIG.3
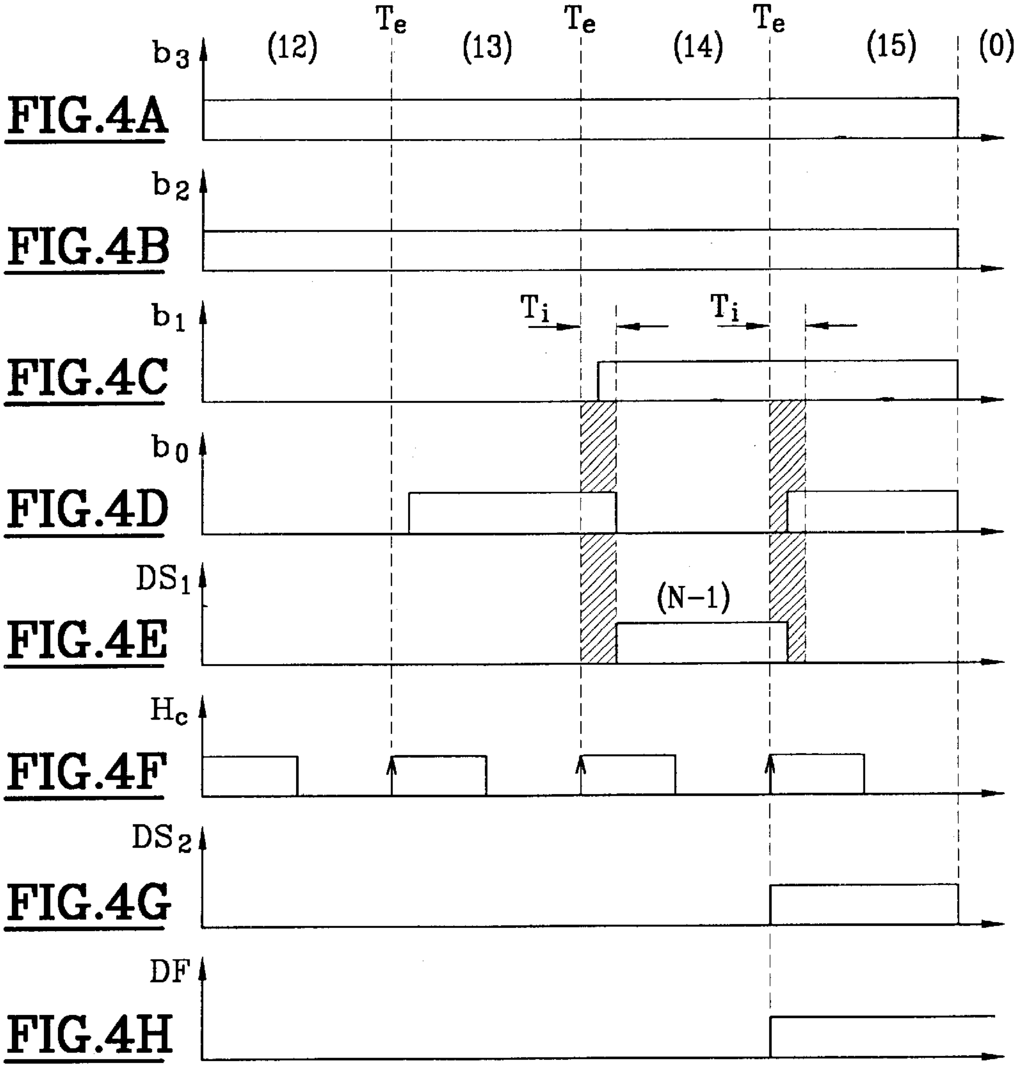
FIG.4A
FIG.4B
FIG.4C
FIG.4D
FIG.4E
FIG.4F
FIG.4G
FIG.4H

RAPID TRIGGERING DIGITAL TIMER

BACKGROUND OF THE INVENTION

1. Technical Field

The present invention relates to a digital timer comprising a binary counter driven by a counting clock signal, the counter presenting a stabilisation time after each counting pulse, and means for delivering a detection signal with a predetermined value when a counting order is reached.

2. Description of the Related Art

Digital timers are broadly used in electronic systems, in particular in microprocessors. Digital timers allow the generation of time bases of variable duration in function of a counting order N and a counting clock signal Hc, a detection signal being emitted when the counting order N is reached. The time between the starting of the timer and the emission of the detection signal is substantially equal to N×Tc, i.e. the product of the order N by the period Tc of the counting signal Hc.

With reference to FIG. 1, Timer 10 comprises a binary counter 1, here a four bit counter, b0 to b3. Counter 1 is driven by a counting clock signal Hc obtained by dividing, by means of a divider 6, the frequency of a clock signal Hs delivered by an oscillator 7. The output of counter 1 is applied to the input of a logic circuit 2 arranged for detecting a number N representing the counting order. The output of logic circuit 2 delivers an intermediate detection signal DS1 applied to the input D of a synchronous type memory latch 4, driven on its clock input CK by the clock signal Hs. The Q output of latch 4 delivers a detection signal DS2 applied to the asynchronous control input "SET" (setting to 1) of another memory latch 5, whose Q output delivers a detection flag DF.

FIGS. 2A to 2H illustrate the operation of timer 10 in the case where, for example, the order N is equal to 15. FIGS. 2A to 2D show respectively the values of the bits b3 to b0 during the counting steps of the numbers 13 to 15. FIGS. 2E to 2H show respectively the intermediate detection signal DS1, the clock signals Hc and Hs and the detection signal DS2.

Latch 4 samples the signal DS1 with the rate of the clock signal Hs and the signal DS2 copies the signal DS1 at each rising edge of that signal. When the order N is reached by the output of counter 1, the intermediate detection signal DS1 changes its value and passes for example to 1. The logic value change of signal DS1, here its passage to 1, causes the passage to 1 of signal DS2 and flag DF.

As well known by those skilled in the art, the passage to 1 or 0 of each bit b0 to b3 is performed with some delay in relation to each rising edge of the counting clock signal Hc, because of the logic signals' propagation time (or transistors' commutation time) in counter 1. Therefore, the signal DS1 presents a stabilization period Ti during which it may present an erroneous value, for example when counting the number 14 if the passage to 0 of the bit b0 is performed with a little delay in relation to the passage to 1 of bit b1 (FIG. 2E). Consequently, the sampling of signal DS1 by latch 4 at a moment when the signal DS1 is erroneous would involve the emission of an erroneous detection signal DS2 and a misleading up-date of flag DF at the output of latch 5.

This drawback is solved in the prior art by off-setting the phase of the clock signals Hc and Hs so that the signal Hs passes to 1 some time after the signal Hc. Thus, as this appears in FIGS. 2E to 2H, sampling latch 4 receives the rising edges of the signal Hs at moment Te when the signal DS1 is stabilized.

However, this conventional solution has the drawback of delaying, for some fractions of period Tc, the emission of the detection signal DS2 and the passage to 1 of the flag DF. In the best case, with a good adjustment of the phase of the clock signals Hc and Hs, the temporal delay is at least equal to the stabilization period Ti. However, in some applications, such a delay is not desirable and it is wished to provide a timer allowing the operation sequence with a better accuracy.

Another drawback of the conventional timer is that the clock signal Hs must not be too rapid compared to the data propagation time in the timer. More particularly, its period Ts must be greater than at least twice the duration of the stabilization period Ti of the counter, in order not to take the risk of sampling an erroneous signal DS1. The present invention is directed to avoid these drawbacks.

SUMMARY OF THE INVENTION

An object of the present invention is to provide a digital timer which offers a great accuracy in the emission of the signal detecting the counting order.

Another object is to provide a digital timer whose accuracy is independent of the frequency of the clock signal Hs.

The above as well as additional objectives, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 shows the structure of a conventional digital timer 10.

FIGS. 2A to 2H are timing diagrams of logic signals illustrating the operation of the timer of FIG. 1.

FIGS. 2A to 2D show respectively the values of the bits b3 to b0 during the counting steps of the numbers 13 to 15.

FIGS. 2E to 2H show respectively the intermediate detection signal DS1, the clock signals Hc and Hs and the detection signal DS2.

FIG. 3 is the electrical diagram of a digital timer according to the invention, and FIGS. 4A to 4H are timing diagrams of logic signals illustrating the operation of the timer according to the invention.

DETAILED DESCRIPTION OF THE PREFERRED EMBODIMENT

The present invention provides a method of emitting a detection signal when a counting order is reached by a binary counter driven by a counting clock signal, the counter presenting a stabilization time after each counting pulse, the method comprising the steps of detecting, at the output of the counter, a counting value which is immediately before the counting order in relation to the counting direction, and delivering the detection signal at a moment when the counter receives the next counting pulse.

According to one embodiment, said counting value is detected by wired logic means whose output is sampled by a synchronous type memory latch driven by the counting clock signal.

The present invention also relates to a digital timer comprising a binary counter driven by a counting clock signal, the counter presenting a stabilization time after each counting pulse, and means for delivering a detection signal with a predetermined value when a counting order is reached, wherein the means for delivering the detection signal comprise wired logic means arranged or programmed for detecting, at the output of the counter, a counting value, which is immediately before the counting order in relation to the counting direction, and delivering an intermediate signal with a predetermined value, and means for sampling the intermediate signal at a moment when the counter receives the next counting pulse.

According to one embodiment, the means for sampling the intermediate signal comprise a first synchronous type latch receiving the output of the logic circuit on its data input and the counting clock signal on its clock input, the output of said latch delivering the detection signal.

According to one embodiment, the detection signal is applied to an asynchronous control input of a second latch whose output delivers a detection flag.

According to one embodiment, the detection signal or the detection flag is applied to a data input of a third latch driven on its clock input by a second clock signal having a frequency higher than the counting clock signal, the output of the third latch delivering a synchronous detection flag synchronized with the second clock signal.

According to one embodiment, the first latch comprises a reset input receiving the synchronous detection flag.

The present invention also relates to a microprocessor comprising a timer according to the invention.

With reference to FIG. 1, Timer 10 comprises a binary counter 1, here a four bit counter, b0 to b3. Counter 1 is driven by a counting clock signal Hc obtained by dividing, by means of a divider 6, the frequency of a clock signal Hs delivered by an oscillator 7. The output of counter 1 is applied to the input of a logic circuit 2 arranged for detecting a number N representing the counting order. The output of logic circuit 2 delivers an intermediate detection signal DS1 applied to the input D of a synchronous type memory latch 4, driven on its clock input CK by the clock signal Hs. The Q output of latch 4 delivers a detection signal DS2 applied to the asynchronous control input "SET" (setting to 1) of another memory latch 5, whose Q output delivers a detection flag DF.

FIG. 3 shows a timer 20 according to the invention, incorporated here in a microprocessor, some elements of which will be described hereafter as secondary elements of timer 20. Timer 20 conventionally comprises a binary counter 21, here a four bit counter b0 to b3, whose output is applied to a logic circuit 22. Counter 21 is driven by a counting clock signal Hc obtained by dividing, by means of a divider 31, the frequency of a clock signal Hs. The signal Hs is here the clock signal of the microprocessor (clock system) delivered by an oscillator 32. The output of logic circuit 22 delivers an intermediate detection signal DS1 which is conventionally applied to the input D of a sampling latch 24. The output Q of latch 24 delivers a detection signal DS2 which is applied to the asynchronous control input "SET" of a memory latch 25. The RESET input of latch 25 receives a signal RST which must be set to 1 for forcing the output Q of latch 25 to 0. The output Q of latch 25 delivers a detection flag DF which is applied to the input D of a latch 29 whose clock input CK receives the clock signal Hs. The output Q of latch 29 delivers a synchronous flag DFs. The synchronous flag DFs is combined with the signal RST by means of an OR gate 30 whose output delivers a signal RSTs applied to the RESET input of latch 24.

FIGS. 4A to 4H illustrate the operation of timer 20 when the order N is equal 15. FIGS. 4A to 4D show respectively the values of the bits b3 to b0 during the counting steps of the numbers 13 to 15, and FIGS. 4E to 4H respectively show the intermediate detection signal DS1, the counting clock signal Hc, the detection signal DS2 and the detection flag DF.

The counting order N being here equal to 15, the logic circuit 22 is arranged or programmed for performing the following function:

*b*3 AND *b*2 AND *b*1 AND /*b*0 and causes the intermediate signal DS1 switching to 1 when the number 14 is reached (FIG. 4E), after the stabilization period Ti has elapsed. Latch 24 samples the signal DS1 at the moment Te when the rising edge of the counting clock signal Hc appears. The signal DS2 is thus set to 1exactly at the moment when counter 21 receives the edge of the clock signal Hc which causes its output passing to the value 15.

Thus, according to the method of the invention, the fact to anticipate the apparition of the number N at the output of counter 21 by detecting the number N−1allows the emission of the signal DS2 without any delay as soon as the apparition of the edge of clock Hc corresponding to the counting of the number N. The flag DF is also quasi-simultaneously set to 1 (FIG. 4H).

Advantageously, the synchronous flag DFs sent back to the RESET input of sampling latch 24 automatically resets said latch immediately upon the first clock pulse Hs following the passage to 1 of flag DF, without needing to wait for the end of the counting cycle of the number N (whose duration is equal to the period Tc of the counting clock signal Hc).

On the other hand, the reset of counter 21 may be conventionally performed by means of an AND gate 33 receiving as inputs the signal RST and the counting clock signal Hc. passage to 1 of the signal RST involves also the setting to 0 of the latches 24, 25.

In practice, the flag DF may be read on the data bus 27 by applying the read control RD to buffer 28. Also, it may be forced at any time to 1 or 0 by sending the wished value on bus 27 and applying the write control WR to latch 25.

It will be readily apparent for the man skilled in the art that the present invention is likely to various alternatives and applications. In particular, the logic values of the various signals and the directions of the triggering edges of counter 21 and latches 24, 29 have been chosen by convention and have been given by way of example only. Also, counter 21 may be arranged as a down-counter. In this case, the value "N−1" is one unit above the order value N, and is for example equal to 1 when the order value is equal to 0. Lastly, logic circuit 22 may be of the pre-wired type in order to detect a predetermined order N or of the programmable type in order to detect any order value.

It is important to note that while the present invention has been described in the context of a fully functional data processing system and/or network, those skilled in the art will appreciate that the mechanism of the present invention is capable of being distributed in the form of a computer usable medium of instructions in a variety of forms, and that the present invention applies equally regardless of the particular type of signal bearing medium used to actually carry out the distribution. Examples of computer usable mediums include: nonvolatile, hard-coded type mediums such as read only memories (ROMs) or erasable, electrically programmable read only memories (EEPROMs), recordable type mediums such as floppy disks, hard disk drives and CD-ROMs, and transmission type mediums such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. Method of emitting a detection signal when a counting order is reached by a binary counter driven by a counting clock signal, the counter presenting a stabilization time after each counting pulse, wherein the method comprises the steps of detecting, at the output of the counter, a counting value which is immediately before the counting order in relation to the counting direction, and delivering the detection signal at a moment when the counter receives the next counting pulse.

2. Method according to claim 1, wherein said immediately before counting value is detected by wired logic means whose output is sampled by a synchronous type memory latch driven by the counting clock signal.

3. Digital timer, comprising a binary counter driven by a counting clock signal, the counter presenting a stabilization time after each counting pulse, and means for delivering a detection signal with a predetermined value when a counting order is reached, wherein the means for delivering the detection signal comprise:

wired logic means arranged or programmed for detecting, at the output of the counter, a counting value which is immediately before the counting order in relation to the counting direction, and delivering an intermediate signal with a predetermined value, and means for sampling the intermediate signal at a moment when the counter receives the next counting pulse.

4. Timer according to claim 3, wherein the means for sampling the intermediate signal comprise a first synchronous type latch receiving said intermediate signal delivered by said wired logic means on its data input and the counting clock signal on its clock input, the output of latch delivering the detection signal.

5. Timer according to claim 3, wherein the detection signal is applied to an asynchronous control input of a second latch whose output delivers a detection flag.

6. The digital timer according to claim 4, wherein the detection signal or the detection flag is applied to a data input of a third latch driven on its clock input by a second clock signal having a frequency higher than the counting clock signal, the output of the third latch delivering a synchronous detection flag synchronized with the second clock signal.

7. Timer according to claim 6, wherein the first latch comprises a reset input receiving the synchronous detection flag.

8. A microprocessor, comprising a timer according to claim 3.

* * * * *